United States Patent
Nakiboğlu et al.

(10) Patent No.: US 11,762,304 B2
(45) Date of Patent: Sep. 19, 2023

(54) LITHOGRAPHIC APPARATUS

(71) Applicant: ASML Netherlands B.V., Veldhoven (NL)

(72) Inventors: Güneş Nakiboğlu, Eindhoven (NL); Maarten Holtrust, Eindhoven (NL); Martinus Van Duijnhoven, Deurne (NL); Francis Fahrni, Eindhoven (NL); Frank Johannes Jacobus Van Boxtel, Eindhoven (NL); Anne Willemijn Bertine Quist, Eindhoven (NL); Bart Dinand Paarhuis, Waalre (NL); Daan Daniel Johannes Antonius Van Sommeren, Beuningen (NL)

(73) Assignee: ASML Netherlands B.V., Veldhoven (NL)

( * ) Notice: Subject to any disclaimer, the term of this patent is extended or adjusted under 35 U.S.C. 154(b) by 223 days.

(21) Appl. No.: 15/570,934

(22) PCT Filed: Mar. 29, 2016

(86) PCT No.: PCT/EP2016/056758
§ 371 (c)(1),
(2) Date: Oct. 31, 2017

(87) PCT Pub. No.: WO2016/177511
PCT Pub. Date: Nov. 10, 2016

(65) Prior Publication Data
US 2018/0299796 A1    Oct. 18, 2018

(30) Foreign Application Priority Data
May 6, 2015 (EP) .................................... 15166563

(51) Int. Cl.
G03F 7/20    (2006.01)
G03F 7/00    (2006.01)

(52) U.S. Cl.
CPC .......... *G03F 7/70858* (2013.01); *G03F 7/709* (2013.01); *G03F 7/70308* (2013.01); *G03F 7/70883* (2013.01); *G03F 7/70891* (2013.01)

(58) Field of Classification Search
CPC .... G01K 11/16; G01K 11/161; G01K 11/172; G01K 11/002; F16F 13/002;
(Continued)

(56) References Cited

U.S. PATENT DOCUMENTS 6,002,987 A * 12/1999 Kamiya .................. G03F 7/709
250/492.2
8,061,476 B2 * 11/2011 Corin ...................... F01N 1/083
181/224
(Continued)

FOREIGN PATENT DOCUMENTS

JP    S6279918 U    5/1987
JP    S6353598      3/1988
(Continued)

OTHER PUBLICATIONS

English translation of JP62-079918. (Year: 1987).*
(Continued)

*Primary Examiner* — Christina A Riddle
(74) *Attorney, Agent, or Firm* — Pillsbury Winthrop Shaw Pittman, LLP (57) ABSTRACT

A lithographic apparatus has: a conduit through which a gas can flow; a gas mover configured to cause the gas to flow in the conduit; a wall in contact with the gas in the conduit and defining a membrane aperture therein; and an acoustic filter including a flexible membrane fixed in the membrane aperture. The acoustic filter reduces transmission of acoustic disturbances without adding any flow resistance.

22 Claims, 10 Drawing Sheets (58) Field of Classification Search
CPC ........ F16F 13/005; F16F 13/08; F16F 13/085; F16F 13/10; F16F 13/101–108; G03F 7/70891; G03F 7/709; G03F 7/70858; G03F 7/70866; G03F 7/70875; G03F 7/70883; G03F 7/70933; G03F 7/708; G03F 7/70808; G03F 7/70266; G03F 7/70308
USPC .............................. 355/30, 52, 53, 67–71, 77
See application file for complete search history.

(56) References Cited

U.S. PATENT DOCUMENTS

| | | | |
|---|---|---|---|
| 8,243,258 | B2 | 8/2012 | Butler et al. |
| 8,675,168 | B2 | 3/2014 | Schultz |
| 8,830,472 | B2 | 9/2014 | Den Boef et al. |
| 9,784,469 | B2 * | 10/2017 | Ramos .................... F24F 13/24 |
| 2007/0163533 | A1 * | 7/2007 | Nakayama ......... F02M 35/1283 123/184.57 |
| 2007/0242245 | A1 * | 10/2007 | Wijckmans ........... F16L 55/053 355/53 |
| 2008/0053749 | A1 | 3/2008 | Utsunomiya |
| 2008/0137097 | A1 * | 6/2008 | Tanaka ................ G03F 7/70775 356/509 |
| 2009/0161085 | A1 | 6/2009 | Butler et al. |
| 2010/0078258 | A1 * | 4/2010 | Tanabe ................. G10K 11/172 181/224 |
| 2010/0171022 | A1 | 7/2010 | Fujimaki et al. |
| 2010/0309445 | A1 | 12/2010 | Schultz |
| 2011/0000741 | A1 | 1/2011 | Berker et al. |
| 2012/0236275 | A1 * | 9/2012 | Van Boxtel ......... G03F 7/70858 355/30 |
| 2013/0287505 | A1 * | 10/2013 | Seibt ...................... E03F 1/006 406/195 |
| 2016/0334718 | A1 * | 11/2016 | Butler ................. F16F 15/0232 |

FOREIGN PATENT DOCUMENTS

| | | |
|---|---|---|
| JP | H06118966 | 4/1994 |
| JP | H06510870 | 12/1994 |
| JP | 2004293365 | 10/2004 |
| JP | 2005248882 | 9/2005 |
| JP | 2007187081 | 7/2007 |
| JP | 2008145203 | 6/2008 |
| TW | I290733 | 12/2007 |
| TW | I405046 | 8/2013 |
| WO | 2014/139323 | 9/2014 |

OTHER PUBLICATIONS

English translation of JP2007-187081. (Year: 2007).*
English translation of JP2004-293365, published Oct. 21, 2004. (Year: 2004).*
International Search Report and Written Opinion dated Jul. 29, 2016 in corresponding International Patent Application No. PCT/EP2016/056758.
Ma, Guancong et al., "Low-frequency narrow-band acoustic filter with large orifice," Applied Physics Letters, vol. 103, pp. 011903-1-011903-4 (2013).
Japanese Office Action issued in corresponding Japanese Patent Application No. 2017-558007, dated Feb. 25, 2020.

* cited by examiner

LITHOGRAPHIC APPARATUS

CROSS-REFERENCE TO RELATED APPLICATIONS

This application is the U.S. national phase entry of PCT patent application no. PCT/EP2016/056758, which was filed on Mar. 29, 2016, which claims the benefit of priority of EP application no. 15166563.5, which was filed on May 6, 2015, and which applications are incorporated herein in its entirety by reference.

BACKGROUND

Field of the Invention

The present invention relates to a lithographic apparatus.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, acoustic disturbances, e.g. noise, can cause imaging errors because the mask, projection system or substrate are momentarily displaced from their optimal positions due to the noise or because the noise causes an error in a measurement. There are many sources of noise within a lithographic apparatus, for example the movements of components of the apparatus—such as the mask table and wafer table—and the movements of fluids—for example immersion liquid, purge gas and temperature conditioning gas. As well as efforts to reduce the sensitivity of the lithographic apparatus to noise, measures to reduce the generation of noise at source have been made. However, the desire to further reduce the sizes of imaged features and to increase throughput mean that further measures to reduce the effects of noise in a lithographic apparatus are desirable.

SUMMARY

It is desirable to provide an approach to the mitigation or amelioration of low frequency pressure pulses in a lithographic apparatus.

According to an aspect of the invention, there is provided a lithographic apparatus configured for imaging a pattern onto a substrate, the apparatus comprising:

a conduit through which a gas can flow;

a gas mover configured to cause the gas to flow in the conduit;

a wall in contact with the gas in the conduit and defining a membrane aperture therein; and an acoustic filter comprising a flexible membrane fixed in the membrane aperture.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
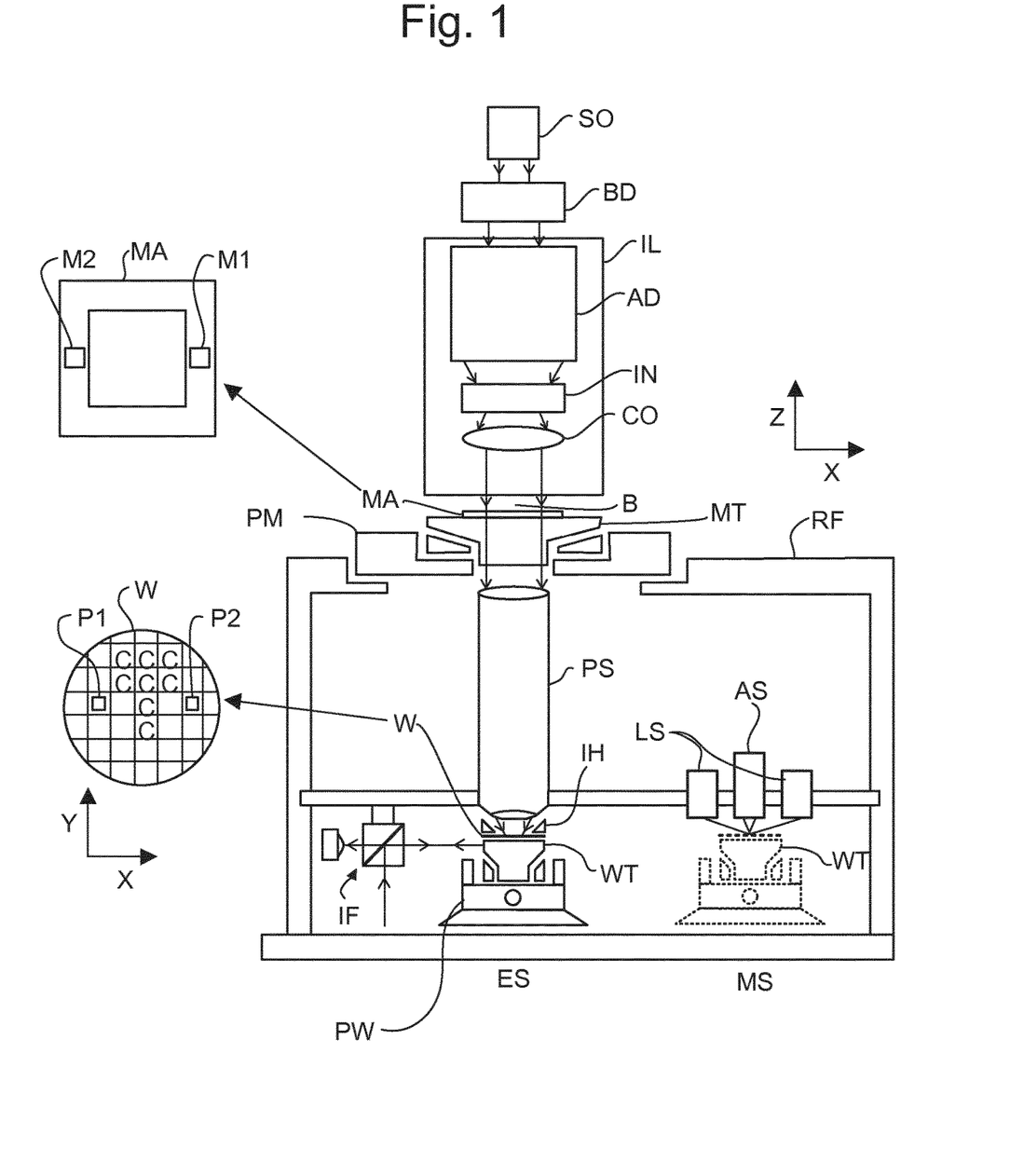
FIG. 1 depicts a lithographic apparatus.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resistcoated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, magnetic, electromagnetic and electrostatic optical systems, or any combination thereof, as appropriate for the exposure radiation being used, or for other factors such as the use of an immersion liquid. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B.

Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW.

In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

In a lithographic apparatus, a purge gas (e.g. nitrogen or pressurized and/or filtered or purified air) is used to ensure a consistent environment for radiation beams and for temperature conditioning. For example, the projection system may be continually flushed with purge gas at high rates of flow in order to ensure that refractive optical elements, e.g. lenses, are maintained at a constant temperature. High flow rates are necessary because the refractive elements absorb energy from the projection beam. The absorption of energy from the beam is not uniform and resulting temperature changes can change the shape of a refractive element, leading to imaging errors. In some lithographic apparatus this phenomenon is employed to effect wavefront corrections.

A wavefront corrector comprises a transparent plate in the beam path and is provided with an array of individually controllable heaters. By selectively heating different parts of the transparent plate, it can be controllably distorted to introduce desired corrections to the wavefront of the projection beam. It is desirable that the average temperature of the wavefront corrector does not deviate from the target temperature of the remainder of the projection system. Therefore a temperature conditioning gas (e.g. nitrogen or pressurized and/or filtered or purified air) is caused to flow over or past the plane plate to remove the heat imparted by the heaters. A high flow rate of the temperature conditioning gas may be required.

The present inventors have determined that the high rate of flow of temperature conditioning gas required to cool the wavelength corrector is a significant source of noise within the lithographic apparatus. In particular, in order to achieve the high flow rates required without a large pressure different—which might distort components of the projection system—it is necessary to provide an active exhaust for the temperature conditioning gas. Thus, a gas mover, e.g. a fan, is provided in the gas conduit downstream of the wavefront converter. The gas mover generates noise which can disturb the lithographic apparatus and cause imaging errors.

The present inventors therefore propose to include an acoustic filter in or adjacent to the gas flow path between a noise source, e.g. a gas mover, and a functional subsystem that is cooled by the gas flow but is sensitive to noise, e.g. the wavefront converter.

Figure 2:
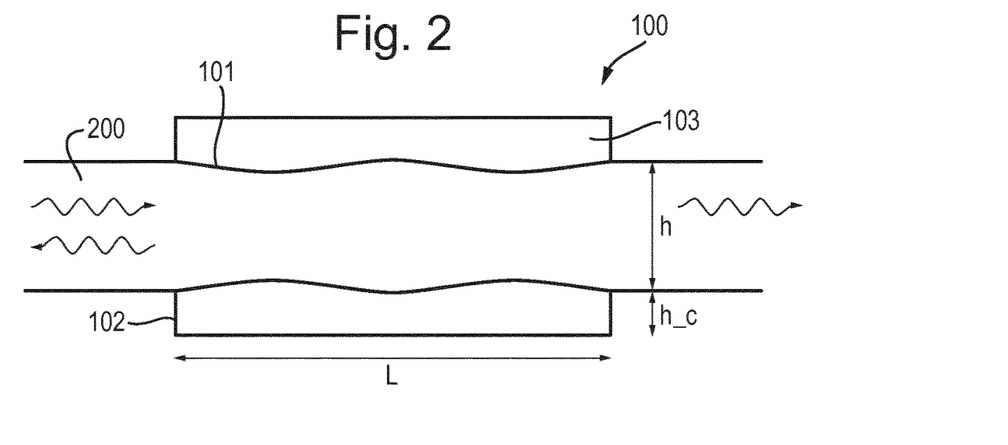
FIG. 2 depicts an acoustic filter usable in an embodiment of the present invention.

An example of a suitable acoustic filter 100 is depicted schematically in FIG. 2. The acoustic filter 100 is provided in line in the gas flow conduit 200. Acoustic filter 100 comprises a flexible membrane 101 which forms a part of the wall of the gas flow conduit 200 and filter walls 102 which define a cavity 103 behind membrane 101. Desirably, in its rest state flexible membrane 101 has the same cross sectional shape and area as the walls of conduit 200. Therefore, acoustic filter 100 does not impart any additional resistance to the mass flow of gas through gas flow conduit 200. However, acoustic filter 100 presents an acoustic impedance to acoustic disturbances propagating along the conduit 200.

Pressure variations in the gas in conduit 200 due to the acoustic disturbances induce vibrations in the flexible membrane 101 and the acoustic impedance is caused by the interactions between the vibrating flexible membrane 101 and the gas flowing in the conduit. Some acoustic energy is absorbed and dissipated in the flexible membrane 101 but a greater effect is that the abrupt change in acoustic impedance between the relatively rigid walls of gas conduit 200 and the flexible membrane 101 causes propagating acoustic disturbances to be reflected back towards their source. This is illustrated in FIG. 2 showing acoustic disturbance propagating from the left of the figure. Some disturbance is transmitted and some disturbance is reflected back to the source.

The reflection, transmission and absorption coefficients of acoustic filter 100 depend on its resonant frequencies. In an embodiment, the acoustic filter has a resonant frequency in the range of from 10 Hz to 1000 Hz, preferably 10 Hz to 100 Hz or 200 Hz to 500 Hz.

The resonant frequencies of the acoustic filter depend on several properties thereof, for example: the length L of flexible membrane 101; the width h of conduit 200; the width h_c of cavity 103; the thickness, density and elastic modulus of flexible membrane 101; the tension of flexible membrane 101; and the pressure and density of filter gas (e.g. nitrogen or pressurized and/or filtered or purified air) in cavity 103. In an embodiment the membrane has a length parallel to the direction of flow of the gas in the range of from 10 mm to 3 m, preferably 50 mm to 2 m.

Figure 3:
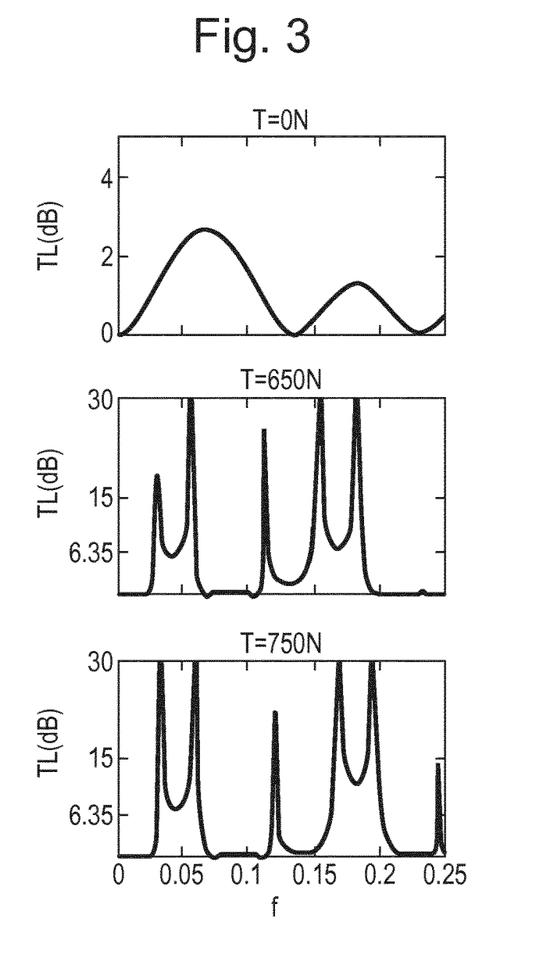
FIG. 3 depicts transmission loss of an acoustic filter used in an embodiment of the invention for different values of membrane tension.

FIG. 3 depicts the effect of varying one of these parameters, specifically the tension in the membrane, in an acoustic filter having a length L of 700 mm in a conduit of diameter h=100 mm and with a cavity height h_c of 20 mm. The three graphs in FIG. 3 depict transmission loss TL in decibels as a function of non-dimensional frequency f. Non-dimensional frequency is defined as $f=\tilde{f} \cdot h/c_0$, where $\tilde{f}$ is frequency in Hz, h is the duct height in m and $c_0$ is the speed of sound in air. It can be seen that with zero tension in the membrane (top graph) there is relatively little transmission loss (less than 3 dB) and the frequency dependence of the transmission loss is quite gentle. When a tension T of 650 N (middle graph) or 750 N (bottom graph) is applied to the membrane, a number of sharp peaks appear in the transmission loss TL, with peak values exceeding 30 dB. With increasing tension, additional transmission loss peaks appear at higher frequencies.

Figure 4:
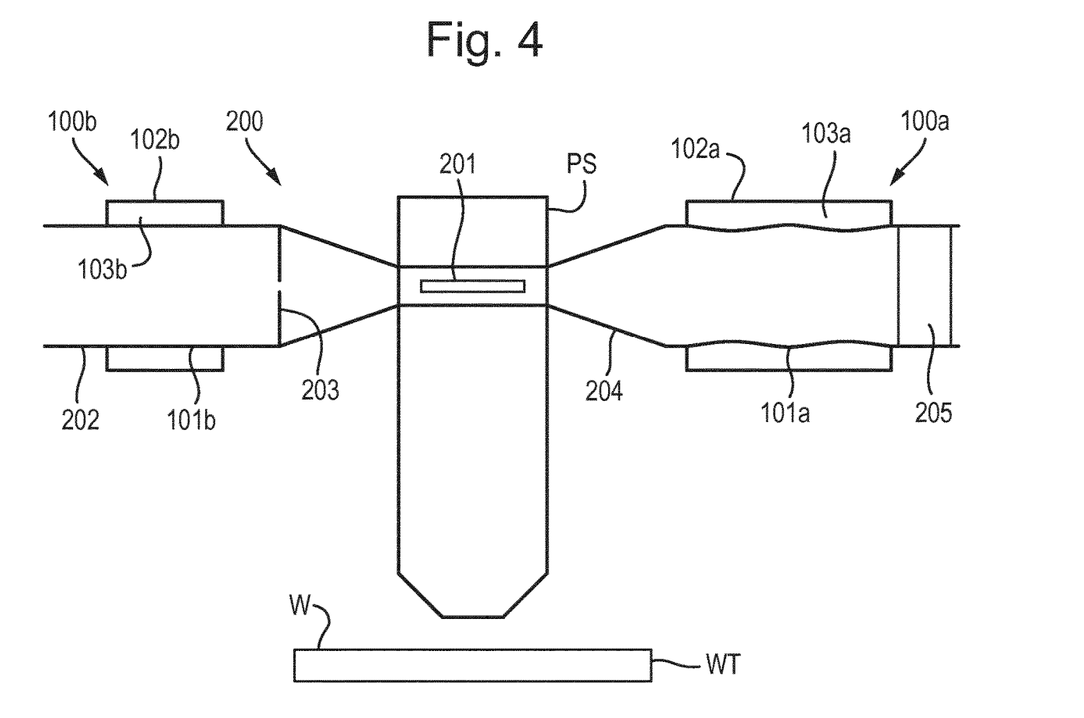
FIG. 4 depicts acoustic filters disposed in the temperature conditioning gas flow of a wavefront corrector of a lithographic apparatus according to an embodiment of the present invention.

FIG. 4 depicts a practical embodiment of acoustic filters in the temperature conditioning system for a wavefront corrector 201. The wavefront corrector 201 is located in the projection system PS of a lithographic apparatus and comprises a plane plate provided with a plurality of individually controllable heaters disposed across its surface. The heaters, e.g. electrical resistive heaters, are selectively energized to locally heat the plane plate so as to create a desired shape change of the plane plate due to thermal expansion of the material thereof. The shape change of the plane plate is calculated to provide a desired wavefront correction for the projection beam. The wavefront correction may, for example, be to compensate for lens heating effects elsewhere in the projection system PS. To effect the desired shape change of the plane plate and to avoid introducing a thermal disturbance into the remainder of the projection system PS, it is desirable that the average temperature of the plane plate does not deviate too far from the target temperature at which the remainder of the projection system PS is maintained. Therefore, a flow of temperature conditioning gas (e.g. nitrogen or pressurized and/or filtered or purified air) over the plane plate is provided. The flow of temperature conditioning gas desirably has a high flow rate in order to transfer away the heat generated in the wavefront converter.

The gas flow conduit 200 which guides the gas over wavelength converter 201 has a supply side 202 and an exhaust side 204. The gas is supplied to the supply side under pressure. An orifice plate 203 is positioned between the supply side of the conduit and the wavelength converter 201. Orifice plate 203 introduces a flow restriction to create a pressure drop by so that the temperature conditioning gas flowing over wavefront corrector 201 is at a low pressure. In the exhaust side 204 a gas mover 205 e.g. a fan, is provided to maintain a flow of gas away from the wavefront corrector 201 in spite of the low gas pressure. Acoustic filter 100a is provided in the exhaust section 204 between wavefront corrector 201 (which is an example of a functional subsystem) and gas mover 205.

Acoustic filter 100a comprises flexible membrane 101a and filter walls 102a which define filter cavity 103a. In embodiments described below, a lower case suffix letter in a reference for a component indicates that the respective component belongs to an acoustic filter referenced by a reference having the same lower case suffix letter.

The dimensions and other parameters of acoustic filter 100a are selected so that acoustic filter 100a exhibits a low transmission coefficient and a high reflection coefficient to frequencies of acoustic disturbances that are generated by gas mover 205 and to which wavefront corrector 201, or another nearby functional subsystem, is sensitive. Multiple acoustic filters can be provided between gas mover 205 and wavefront converter 201 if desirable to ensure that wavefront converter 201 is protected from all undesirable frequencies of acoustic disturbances.

A second acoustic filter 100b is provided on the supply side 202 of the conduit 200. Again, acoustic filter 100b comprises flexible membrane 101b and filter walls 102b defining filter cavity 103b. Acoustic filter 100b has its dimensions and other parameters selected so as to reduce transmission to wavefront corrector 201, and/or any other nearby functional subsystems, of noise generated in the gas supply and in the upstream gas supply path. Whilst a gas mover may generate most noise at particular frequencies, flow noise is likely to be spread more uniformly across a range of frequencies. Although an acoustic filter according to an embodiment of the present invention provides peak transmission losses at relatively narrow frequency bands, multiple acoustic filters can be deployed in series so that the total transmission loss extends across a wider range of frequencies. Alternatively or in addition, the acoustic filter(s) can be selected to provide a high transmission loss at certain frequencies to which the functional subsystem(s) being protected is(are) most sensitive.

It will be noted that an acoustic filter according to an embodiment of the present invention can be used both when the direction of propagation of acoustic disturbances is with the gas flow direction and when the direction of propagation of acoustic disturbances is against the gas flow direction.

Another advantage of an acoustic filter according to the present invention is that it does not generate flow noise in itself. Conventional mufflers involving baffles can generate significant flow noise.

Another advantage of an acoustic filter according to the present invention is that it causes no or minimal flow resistance.

Another advantage of an acoustic filter according to the present invention is that it does not introduce a contamination risk since the filter cavity 103 is sealed from the conduit by flexible membrane 101 which can readily be made of cleanroom-compatible materials. Conventional mufflers involving fibrous material, such as wool, can introduce a contamination risk.

An acoustic filter according to an embodiment of the present invention can be used anywhere in a lithographic apparatus where there is a gas flow. The example of the flow of temperature conditioning gas for a wavefront corrector described above is especially advantageous because of the high gas flow rates involved. Other parts of a lithographic apparatus that might involve high gas flows and to which the present invention is particularly applicable include: air mounts (gas bearings), purge gas flows for optical systems, gas showers and wafer load/unload locks.

Figure 5:
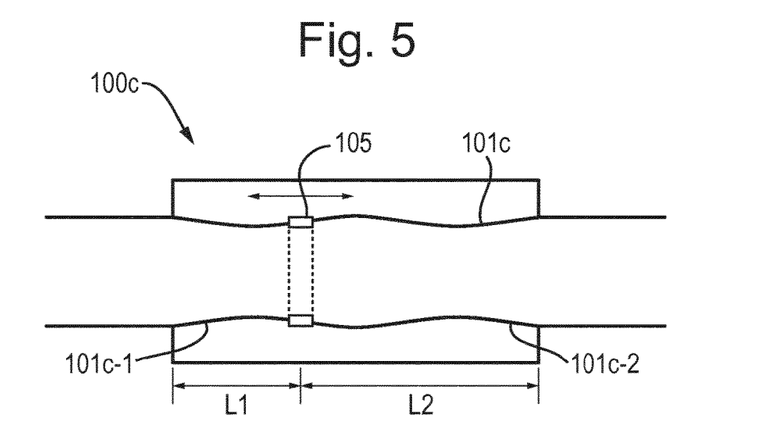
FIG. 5 depicts another acoustic filter usable in an embodiment of the present invention.

FIG. 5 depicts a further acoustic filter 100c which can have its resonant behavior, and hence transmission profile adjusted. Acoustic filter 100c is provided with an adjuster comprising a clamp member 105 which is movable in a direction parallel to the gas flow direction, i.e. along the length of membrane 101c. In effect, clamp 105 divides membrane 101c into two sub-membranes 101c-1, 101c-2 having respective lengths L1 and L2. Each of the sub-membranes 101c-1, 101c-2 will have its own resonant frequencies determined by the respective lengths L1 and L2 and the other parameters of the acoustic filter. The transmission loss of acoustic filter 100c is substantially equivalent to the sum of the transmission losses of two separate acoustic filters having membranes of lengths L1 and L2 respectively.

Clamp member 105 can be configured so that it is adjustable in set up of the apparatus or provided with an actuator so that it is adjustable during operation of the lithographic apparatus. Clamp 105 can be fixedly connected to the membrane 101 so that moving it in the direction parallel to the gas flow changes the respective tensions in the sub-membranes 101c-1, 101c-2. Alternatively, clamp 105 can be arranged so that it slides relative to membrane 101c in which case the resonant behavior of the acoustic filter 100c is changed by varying the lengths L1, L2 of the two sub-membranes 101c-1, 101c-2. Clamp 105 can also be configured so that it allows only vibrational modes of the membrane that have a node at the clamp position.

In an embodiment of the present invention an acoustic filter can be provided with an adjuster comprising multiple clamps spaced along the flexible membrane 101. Alternatively or in addition, clamp 105 can be configured as a telescoping member inside or outside of flexible membrane 101 so that by changing the length as well as the position of the telescoping clamp, independent control of lengths L1, L2 can be achieved. In an embodiment clamp 105 is configured as a telescoping member extending inward parallel to the flow direction from one end of acoustic filter 100 so that the free length of membrane 101 can be adjusted without creation of a second sub-membrane.

Figure 6:
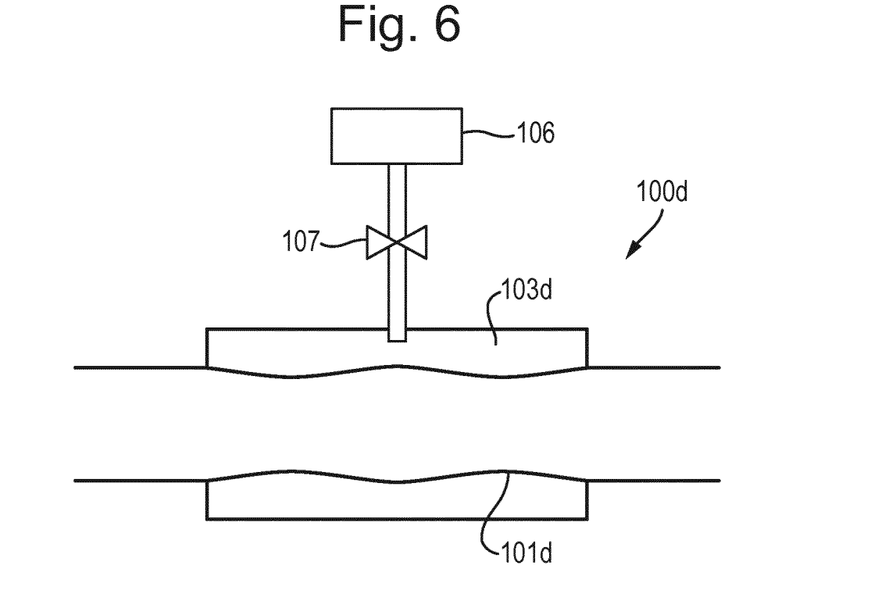
FIG. 6 depicts another acoustic filter usable in an embodiment of the present invention.

FIG. 6 depicts another acoustic filter 100d according to an embodiment of the present invention that is adjustable in use. A pressure adjuster, e.g. comprising a gas supply 106 and valve 107, is provided to enable the pressure of the gas in cavity 103d. Changing the pressure in the cavity 103d alters the resonant behavior of the acoustic filter and therefore the frequency dependence of the transmission loss, e.g. through changing the tension in flexible membrane 101d.

Figure 7:
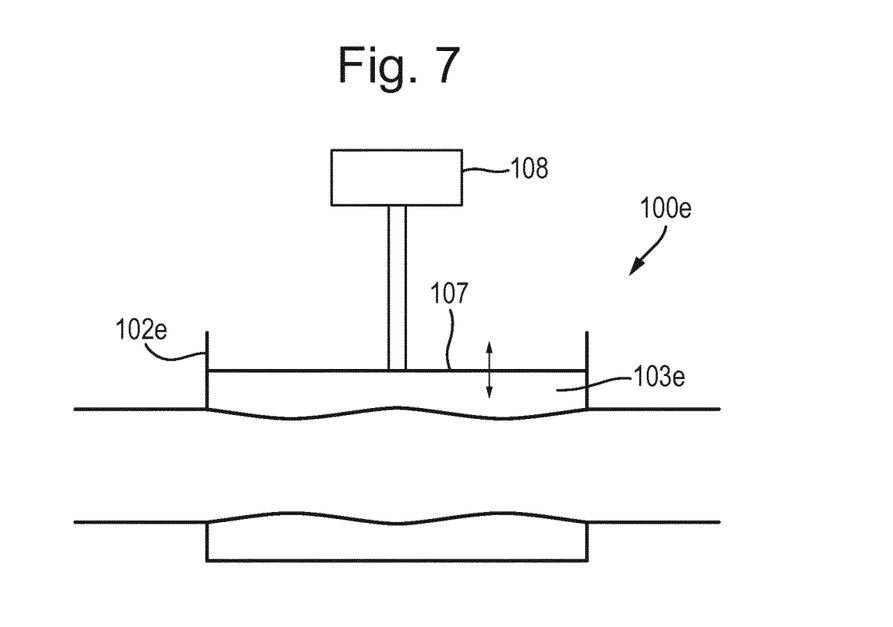
FIG. 7 depicts another acoustic filter usable in an embodiment of the present invention.

FIG. 7 depicts another acoustic filter 100e according to an embodiment of the present invention that is adjustable in use. In acoustic filter 100e, an adjuster comprises movable piston 107 which is connected to actuator 108 and forms at least a part of one of the filter walls 102e. The resonant properties, and therefore the frequency dependence of the transmission loss, of acoustic filter 101e can be varied by moving piston 107 so as to change the effective height of cavity 103e and/or the pressure of gas in cavity 103e.

Figure 8:
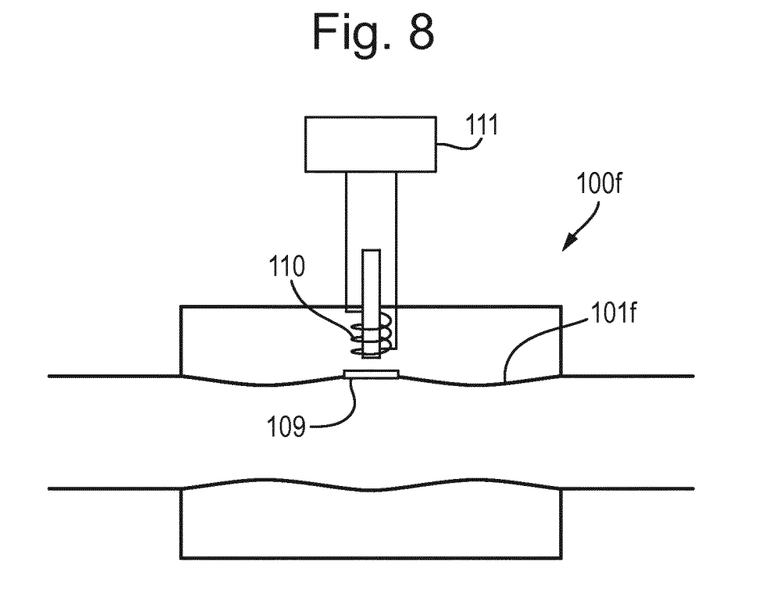
FIG. 8 depicts another acoustic filter usable in an embodiment of the present invention.

FIG. 8 depicts another acoustic filter 100f according to an embodiment of the present invention that is adjustable in use. Acoustic filter 100f has an adjuster comprising a magnetic member 109 fixed to membrane 101*f* and an electromagnet 110 driven by drive circuit 111, which is provided within cavity 103*f* near magnetic member 109. Magnetic member 109 may be a permanent magnet or an unmagnetised but magnetic, e.g. ferromagnetic, material. By varying the current through electromagnet 110, magnetic member 109 can be attracted and/or repelled thus exerting a controllable local force on membrane 101*f*. The resonant properties thereof are thereby adjusted and hence the frequency dependence of the transmission loss of the acoustic filter 100*f*. Acoustic filter 100*f* may be provided with a plurality of magnetic members 109 spaced apart on the membrane 101*f* along with respective independently controllable electromagnets 110.

In a particularly simple variant of the embodiment of FIG. 8, magnetic member 109 is a permanent magnet and electromagnet 110 is provided with a switch or switches so that the coils thereof can be short circuited or varied in effective length. In this way, a controllable damping effect can be created by varying the impedance of the coil and hence back electro-magnetic forces exerted on magnet member 109 when it vibrates.

Figure 9:
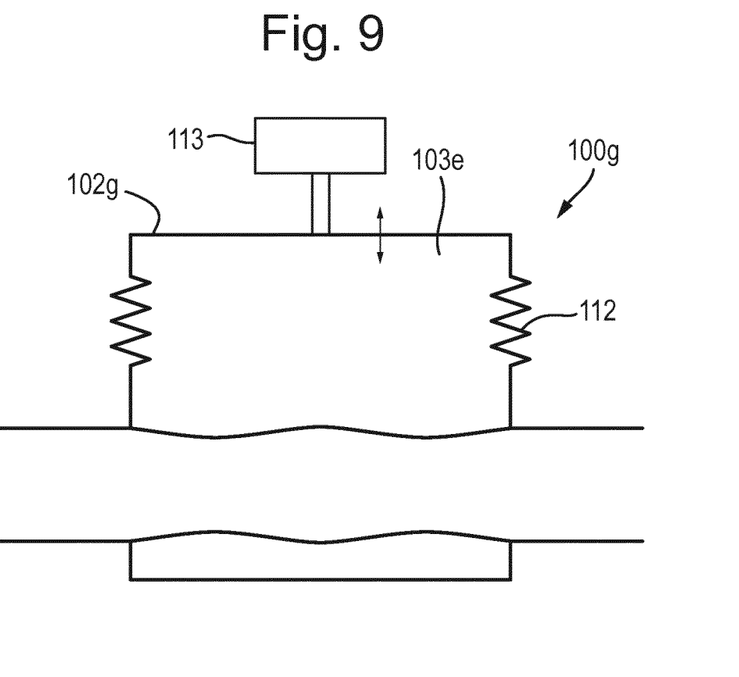
FIG. 9 depicts another acoustic filter usable in an embodiment of the present invention.

FIG. 9 depicts another acoustic filter 100*g* according to an embodiment of the present invention that is adjustable in use. In acoustic filter 100*g* the adjuster comprises a part of cavity wall 102*g*, which is constructed as a bellows 112, and an actuator 113, which is provided to move the cavity wall 102*g* so as to change the effective volume of cavity 103*g* and/or the effective gas pressure therein.

It will be appreciated that a lithographic apparatus according to an embodiment of the present invention can include multiple acoustic filters according to one or more of the different variants described above. Also, a single acoustic filter can be provided with multiple adjusters according to the different principles described above for adjusting the properties thereof.

An adjustable acoustic filter according to an embodiment of the invention can be configured to be adjustable at the time of construction and/or servicing or calibration. An adjuster of an acoustic filter according to an embodiment of the present invention can be configured to be adjustable during use of the lithographic apparatus for the exposure of substrates, e.g. in synchronism with other events occurring in the apparatus. For example, an acoustic filter according to an embodiment of the present invention can be adjusted in synchronism with, or in response to, changes in gas flow rate in the protected conduit and/or changes in speed of a gas mover such as a fan.

An acoustic filter 100 according to an embodiment of the invention may take various forms in cross-section, some examples of which are illustrated in FIGS. 10 to 13.

Figure 10:
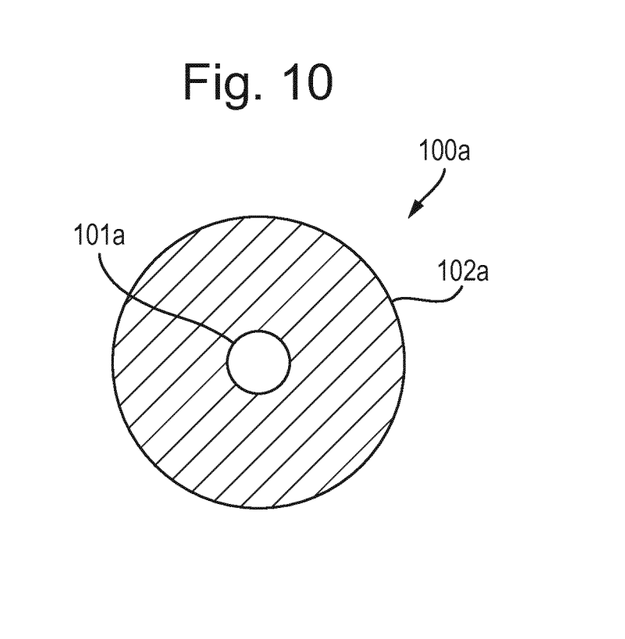
FIG. 10 is a cross sectional view of an acoustic filter of FIG. 4.

In its simplest form, the membrane 101*a* takes the form of a hollow tube or cylinder having the same diameter as the conduit 200 and concentric therewith. This ensures that no additional flow resistance is imparted. The filter walls 102*a* can also be cylindrical in form and concentric with the membrane 101*a*. Such an arrangement is simple to manufacture and provides a cavity with constant height $h\_c$ so that the acoustic behavior of the acoustic filter is simple and readily predictable.

Figure 11:
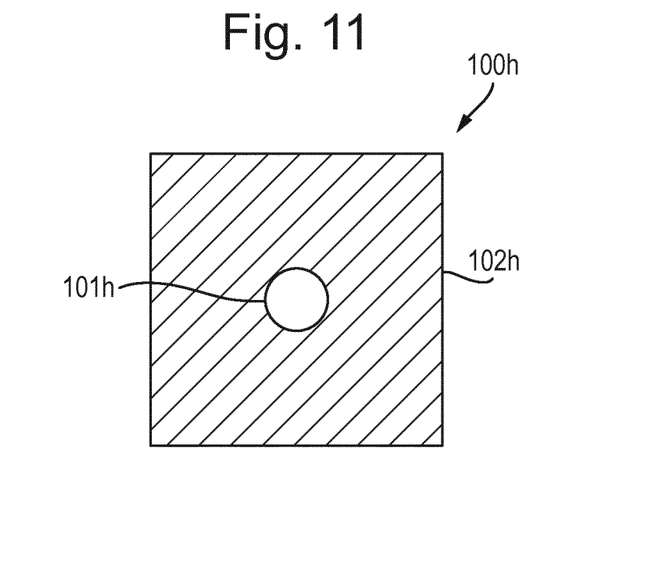
FIG. 11 is a cross section of another acoustic filter usable in an embodiment of the present invention.

An alternative acoustic filter 100*h* is illustrated in FIG. 11. The flexible membrane 101*h* is again cylindrical and concentric with the conduit 200. However, cavity walls 102*h* form a cuboid, which may be square in cross-section perpendicular to the direction of flow of gas in the conduit. Such an arrangement can be simple to manufacture and can make most effective use of available volume within the lithographic apparatus. However, the acoustic behavior of the acoustic filter is more complex due to the variation in effective height $h\_c$ of the cavity. Such complex behavior can be advantageous in providing a broader peak of transmission loss.

Figure 12:
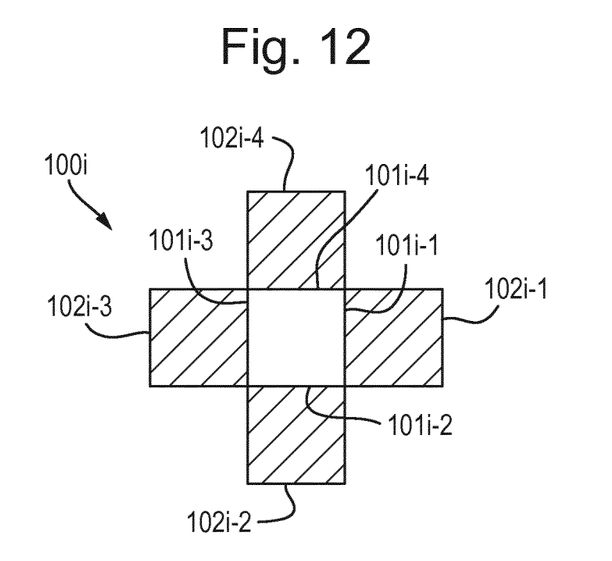
FIG. 12 is a cross section of another acoustic filter usable in an embodiment of the present invention.

A further alternative acoustic filter 100*i* is depicted in FIG. 12. This arrangement is suitable for use where conduit 200 is rectangular, e.g. square in cross section. Membrane 101*i* is made up of four flat membranes 101*i*-1, 101*i*-2, 101*i*-3, 101*i*-4 which are joined at longitudinal edges to form a square prism structure that preferably matches in shape and size the conduit 200. Cavity walls 102*i*-1 to 102*i*-4 are provided to form respective cavities behind each flat membrane 101*i*. The flat membranes 101*i* can be anchored to the cavity walls 102*i* at the edges. Such an arrangement can provide predictable behavior of the acoustic filter and allow separate optimization of the individual parts thereof.

Figure 13:
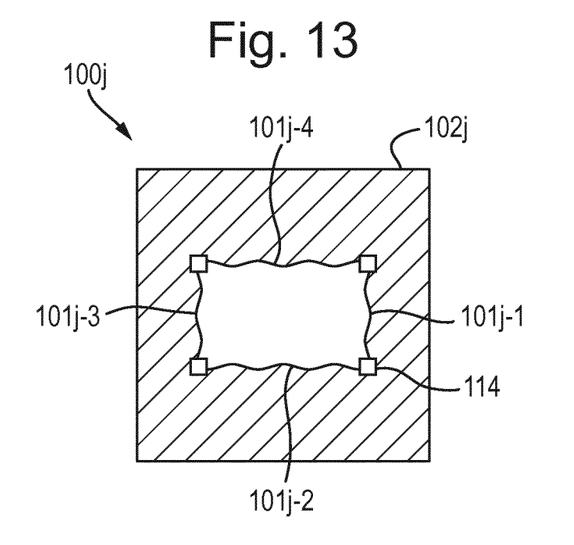
FIG. 13 is a cross section of another acoustic filter usable in an embodiment of the present invention.

Another acoustic filter 100*j* is depicted in FIG. 13. This again is suitable for use with a conduit having a rectangular cross section. Similarly to the embodiment of FIG. 12, membrane 100*j* is made up for four separate flat membranes 100*j*-1 to 100*j*-4. These are anchored to support members 114 along their longitudinal edges to form a sealed flow path. Cavity walls 102*j* take the form of a cuboid completely surrounding the membrane 101*j* and support members 114 to form a single cavity around the flexible membrane 101*j*. Such an arrangement can be simple to manufacture and can make most effective use of available volume within the lithographic apparatus.

Figure 14:
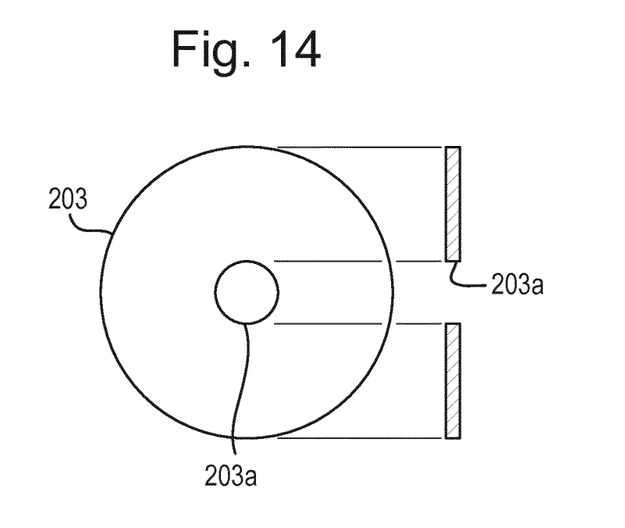
FIG. 14 is an orifice plate useable for flow control in a gas conduit in a lithographic apparatus.

FIG. 14 depicts a conventional orifice plate 203 that is usable as a flow restrictor in the supply side of a conduit for a flow of temperature conditioning gas used to cool a wavefront corrector. Orifice plate 203 consists of a simple plate with a central circular aperture 203*a*. The size of aperture 203*a* is determined to impart a desired flow resistance.

The present inventors have determined that the orifice plate can be improved by incorporation of an acoustic filter therein.

Figure 15:
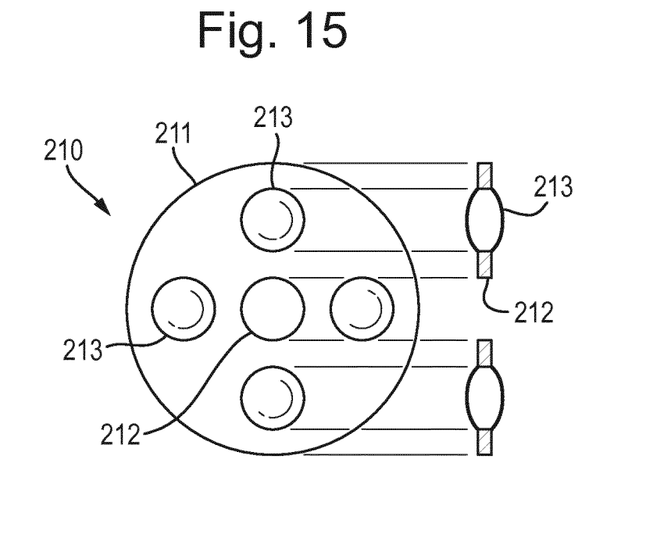
FIG. 15 depicts an orifice plate incorporating an acoustic filter useable in an embodiment of the present invention.

FIG. 15 depicts an orifice plate 210 according to an embodiment of the invention that incorporates an acoustic filter. Orifice plate 210 comprises a plate 211 that has a flow restriction aperture 212 equivalent to the aperture 203*a* of the conventional orifice plate. The size of flow restriction aperture 212 is determined to impart a desired flow resistance. In addition a plurality of filter apertures are provided in plate 211, each filter aperture being sealed by a flexible membrane 213. A mass may be provided on each flexible membrane 213, e.g. in the center thereof.

Figure 16:
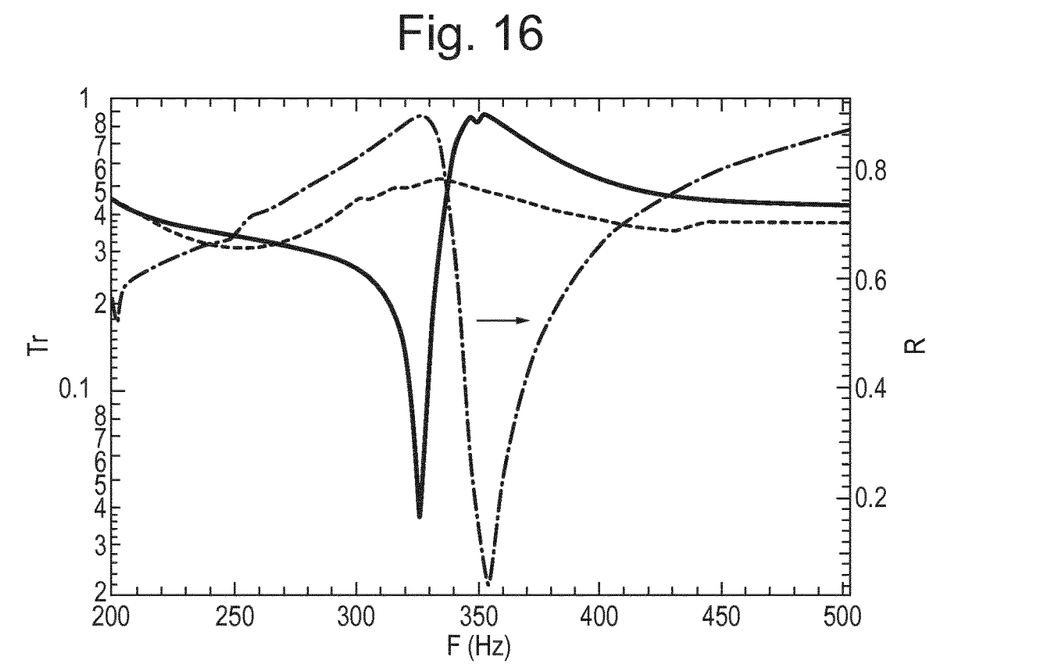
FIG. 16 depicts transmission and reflection coefficients of an orifice plate including an acoustic filter.

Acoustic disturbances propagating towards orifice plate 210 excite flexible membranes 213 to vibrate. Flexible membranes 213 can exhibit different vibrational modes. In some vibrational modes, the average displacement of the flexible membrane is zero, i.e. different parts of the flexible membrane vibrate out-of-phase with each other. At frequencies corresponding to these vibrational modes, the orifice plate presents a very low transmission Tr and a very high reflectance R. At other frequencies the orifice plate may have a high transmission Tr and a low reflectance R. This is illustrated in FIG. 16 which depicts measured transmission Tr (solid line) and reflectance R (dot chain line) as a function of frequency F. For comparison the transmission Tr of a conventional orifice plate is also shown (dashed line).

Figure 17:
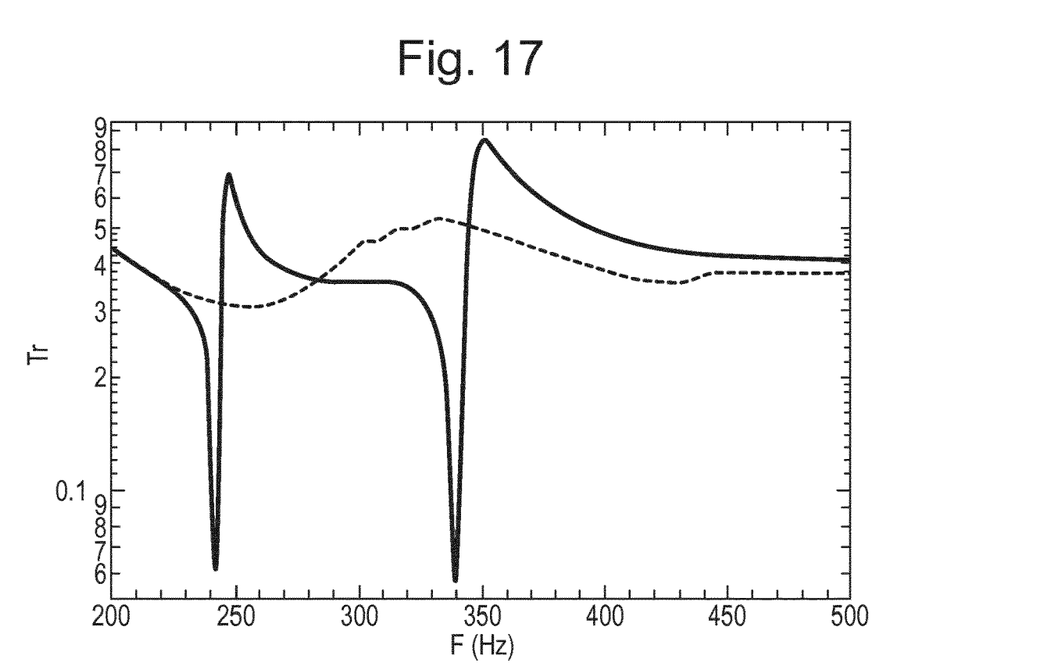
FIG. 17 is a graph of measured transmission coefficients of a dual-frequency acoustic filter.

The frequencies of the transmission minima of an orifice plate 210 can be selected by selecting the parameters of the flexible membranes 213, for example tension, thickness, elastic modulus and the mass of any attached mass. In an embodiment of the invention an adjuster is provided to adjust a parameter of one or more of the flexible membranes. The adjuster can operate according to any of the principles described above. An orifice plate 211 can be configured to have multiple transmission minima, e.g. by using different membranes in different filter apertures. FIG. 17 shows a measured transmission coefficient Tr for a dual frequency orifice plate (solid line) along with the transmission Tr of a conventional orifice plate (dashed line) for comparison.

In an embodiment of the invention, the orifice plate 211 is configured to have one or more transmission minima at a frequency that is either prevalent in the lithographic apparatus or to which a functional subsystem to be protected is particularly sensitive.

FIGS. 18 to 24 depict several variants of the orifice plate 211, illustrating various changes that can be made to achieve a desired frequency dependence.

Figure 18:
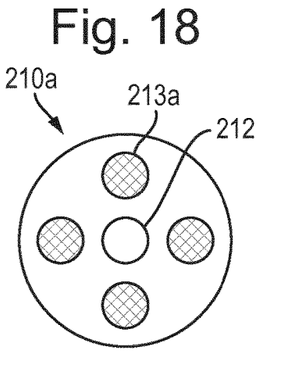
FIGS. 18 to 24 depict several variations of orifice plates including an acoustic filter usable in an embodiment of the invention.

FIG. 18 depicts a simple orifice plate 210a with four equivalent flexible membranes 213a spaced evenly around the flow restriction aperture 212.

Figure 19:
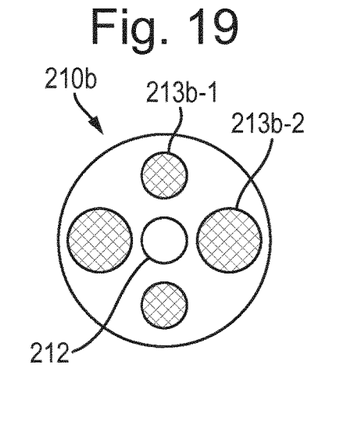

FIG. 19 depicts an orifice plate 210b with four flexible membranes 213b spaced evenly around the flow restriction aperture 212. Two flexible membranes 213b-1 are small and two flexible membranes 213b-2 are large. Orifice plate 210b is a dual frequency orifice plate.

Figure 20:
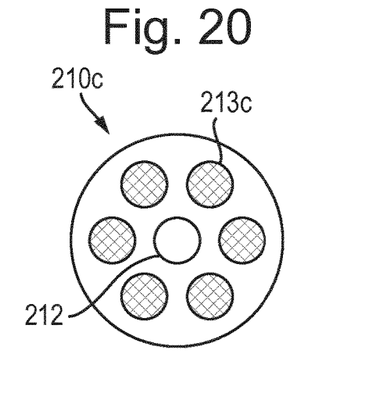

FIG. 20 depicts an orifice plate with six equivalent flexible membranes 213c spaced evenly around the flow restriction aperture 212. Compared to orifice plate 210a. orifice plate 210c may have a lower transmission at the transmission minima.

Figure 21:
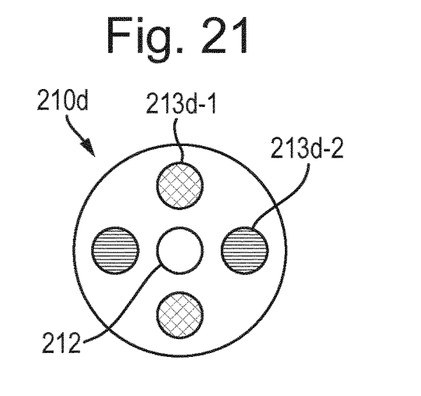

FIG. 21 depicts an orifice plate 210d with four flexible membranes 213d spaced evenly around the flow restriction aperture 212. Two flexible membranes 213d-1 have a different membrane material and/or tension and/or a different attached mass than the other two flexible membranes 213d-2. Orifice plate 210b is a dual frequency orifice plate.

Figure 22:
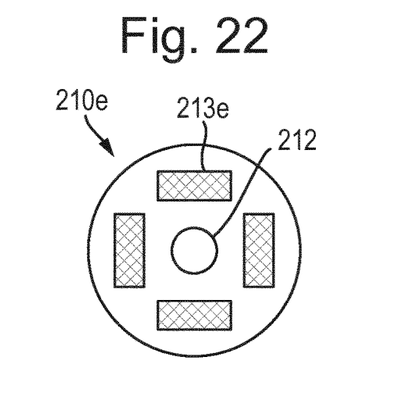

FIG. 22 depicts an orifice plate 210e with four equivalent flexible membranes 213e spaced evenly around the flow restriction aperture 212. Flexible membranes 213e are rectangular in shape and may demonstrate a more complex frequency dependence than circular membranes.

Figure 23:
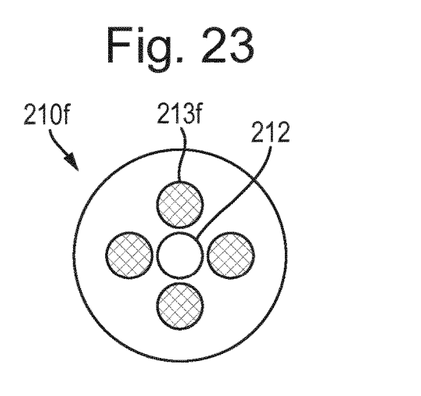

FIG. 23 depicts an orifice plate 210f with four equivalent flexible membranes 213f spaced evenly around the flow restriction aperture 212. Flexible membranes 213f are positioned closer to the flow restriction aperture than are the flexible membranes 213a in orifice plate 210a. The location of the flexible membrane can be a useful parameter to optimize for performance and/or constructional reasons.

Figure 24:
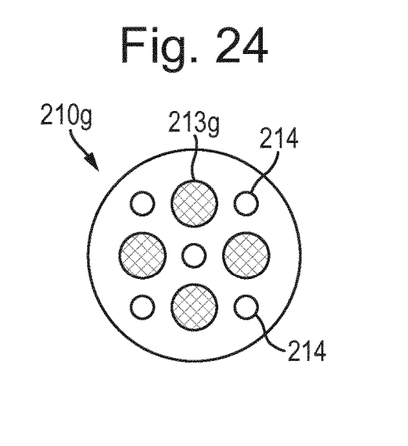

FIG. 24 depicts an orifice plate 210g with four equivalent flexible membranes 213g spaced evenly around the center thereof. The single centrally-located flow restriction aperture 212 of previously described embodiments is replaced by a plurality of smaller flow restriction apertures 214 spaced apart in between the flexible membranes 213g. A plurality of small flow restriction apertures can generate less flow noise than a single larger flow restriction aperture of equivalent effect.

In an embodiment of the invention a plurality of orifice plates incorporating acoustic filters can be provided in series in a gas flow path. The total transmission loss of such a series is substantially equal to the sum of the transmission losses of each orifice plate, provided a space is provided between adjacent orifice plates. A broadband filtering effect can thereby be achieved.

In an embodiment, an orifice plate incorporating an acoustic filter is used with one or more acoustic filters of the type described above with reference to FIGS. 2 to 13. In an embodiment, an orifice plate incorporating an acoustic filter is used without an acoustic filter of that type.

In an embodiment, there is provided a lithographic apparatus configured for imaging a pattern onto a substrate, the apparatus comprising: a conduit through which a gas can flow; a gas mover configured to cause the gas to flow in the conduit; a wall in contact with the gas in the conduit and defining a membrane aperture therein; and an acoustic filter comprising a flexible membrane fixed in the membrane aperture.

In an embodiment, the acoustic filter has a resonant frequency in the range of from 10 Hz to 1000 Hz, desirably in the range of from 10 Hz to 100 Hz or in the range of from 200 Hz to 500 Hz. In an embodiment, the acoustic filter further comprises an adjuster configured to adjust a resonant frequency of the flexible membrane. In an embodiment, the adjuster is configured to adjust a tension of the membrane. In an embodiment, the adjuster is configured to adjust a free length of the membrane. In an embodiment, the adjuster is configured to adjust a position of a node of the membrane. In an embodiment, the adjuster comprises a magnetic member mounted on the membrane and a magnetic field generator. In an embodiment, the wall is a side wall of the conduit and the acoustic filter further comprises a filter wall defining a cavity adjacent the flexible membrane and outside the conduit. In an embodiment, the lithographic apparatus further comprises a pressure adjuster configured to adjust a pressure of gas in the cavity. In an embodiment, the membrane extends substantially completely around the conduit. In an embodiment, the membrane has a length parallel to the direction of flow of the gas in the range of from 10 mm to 3 m, desirably in the range of from 50 mm to 2 m. In an embodiment, the wall extends across the conduit and has a flow aperture configured to allow the gas to flow therethrough. In an embodiment, the wall has a plurality of membrane apertures therein and a corresponding plurality of membranes, each membrane being fixed in a respective one of the membrane apertures. In an embodiment, a first one of the plurality of membranes differs from a second one of the plurality of membranes in at least one parameter selected from the group consisting of: size, tension, density, modulus of elasticity, and shape. In an embodiment, the lithographic apparatus comprises a plurality of acoustic filters as described herein. In an embodiment, the lithographic apparatus further comprises a functional subsystem, wherein the gas flows past or through the functional subsystem to control the temperature of the functional subsystem and the acoustic filter is located between the functional system and the gas mover. In an embodiment, the gas mover causes the gas to move away from the functional system towards the gas mover. In an embodiment, the functional subsystem is a wavefront adjuster having a selectively heatable plane plate and wherein the gas flowing in the conduit cools the selectively heatable plane plate. In an embodiment, the functional subsystem is an optical system for imaging the pattern on the substrate. In an embodiment, the functional subsystem is an alignment system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

Although specific reference may have been made above to the use of embodiments of the invention in the context of optical lithography, it will be appreciated that the invention may be used in other applications, for example imprint lithography, and where the context allows, is not limited to optical lithography. In a lithographic apparatus that employs very short wavelength radiation to expose substrates, parts of the lithographic apparatus traversed by the radiation beam, e.g. the substrate stage compartment, may be filled with a low pressure of gas, e.g. hydrogen or helium, so as to minimize absorption of the very short wavelength radiation. The low pressure may be referred to as a "vacuum" environment but the present invention is applicable if the gas pressure in a part of the lithographic apparatus is sufficient to transmit acoustic disturbances.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus configured to image a pattern onto a substrate, the apparatus comprising:
   a conduit through which a gas flow can flow, the conduit having an axis;
   a wall arranged to be in contact with the gas flow in the conduit and defining one or more membrane apertures therein; and
   an acoustic filter comprising one or more flexible membranes fixed in the one or more membrane apertures, wherein one flexible membrane extends substantially completely around the axis of the conduit or a plurality of flexible membranes are arranged around the axis of the conduit, wherein the one flexible membrane or plurality of membranes is arranged such that at least part of the gas flow is incident on a first side of the one flexible membrane or plurality of membranes and such that at least part of the gas flow that flows in the conduit in a direction along the axis and that passes the one flexible membrane or plurality of membranes in that direction is incident on a second, opposite side of the same one flexible membrane or plurality of membranes.

2. The lithographic apparatus of claim 1, wherein the acoustic filter has a resonant frequency selected from the range of from 10 Hz to 1000 Hz.

3. The lithographic apparatus of claim 1, wherein the acoustic filter further comprises an adjuster configured to adjust a resonant frequency of one or more of the one or more flexible membranes.

4. The lithographic apparatus of claim 1, further comprising one or more further flexible membranes in a side wall of the conduit and further comprising a filter wall defining a cavity adjacent one or more of the one or more further flexible membranes and outside the conduit.

5. The lithographic apparatus of claim 4, further comprising a pressure adjuster configured to adjust a pressure of gas in the cavity.

6. The lithographic apparatus of claim 4, wherein one or more of the one or more further flexible membranes has a length parallel to the direction of flow of the gas selected from the range of from 10 mm to 3 m.

7. The lithographic apparatus according to claim 4, comprising the peripheral portion of a major surface of the one or more of the one or more further flexible membranes being flush with a major surface of the interior of the conduit, wherein portions of the one or more of the one or more further flexible membranes are located on opposite sides of the axis.

8. The lithographic apparatus of claim 1, further comprising a functional subsystem, wherein the gas flows past or through the functional subsystem to control the temperature of the functional subsystem, and the acoustic filter is located between the functional system and a gas mover configured to cause the gas to flow in the conduit.

9. The lithographic apparatus of claim 8, wherein the gas mover is configured to cause the gas to move away from the functional system towards the gas mover.

10. The lithographic apparatus according to claim 8, wherein the functional subsystem is a wavefront adjuster having a selectively heatable plane plate and wherein the gas flowing in the conduit cools the selectively heatable plane plate.

11. The lithographic apparatus according to claim 8, wherein the functional subsystem is an optical system configured to image the pattern on the substrate.

12. The lithographic apparatus according to claim 8, wherein the functional subsystem is an alignment system.

13. The lithographic apparatus according to claim 1, comprising the plurality of flexible membranes arranged around the axis of the conduit, wherein the plurality of membranes is arranged such that at least part of the gas flow is incident on a first side of the plurality of membranes and such that at least part of the gas flow that flows in the conduit in a direction along the axis and that passes the plurality of membranes in that direction is incident on a second, opposite side of the same plurality of membranes.

14. A lithographic apparatus configured to image a pattern onto a substrate, the apparatus comprising:
   a conduit through which a gas can flow, the conduit having an axis;
   a wall arranged to be in contact with the gas in the conduit and defining one or more membrane apertures therein; and
   an acoustic filter comprising a plurality of flexible membranes fixed in the one or more membrane apertures, wherein the plurality of flexible membranes are arranged around the axis of the conduit such that an imaginary plane transverse to the axis passes through each of flexible membranes and the gas that flows in the conduit in a direction along the axis passes the plurality of membranes in that direction.

15. The lithographic apparatus of claim 14, wherein the acoustic filter has a resonant frequency selected from the range of from 10 Hz to 1000 Hz.

16. A lithographic apparatus configured to image a pattern onto a substrate, the apparatus comprising:
   a conduit through which a gas can flow, the conduit having an axis; and
   an acoustic filter comprising one flexible membrane that extends substantially completely around the axis of the conduit or a plurality of flexible membranes that are arranged around the axis of the conduit, wherein the one flexible membrane or plurality of membranes is arranged such that at least part of the gas flow is incident on a first side of the one flexible membrane or plurality of membranes and such that at least part of the gas flow that flows in the conduit in a direction along the axis and that passes the one flexible membrane or plurality of membranes in that direction is incident on a second, opposite side of the same one flexible membrane or plurality of membranes.

17. The lithographic apparatus according to claim 16, further comprising an adjuster configured to adjust a resonant frequency of the one or more flexible membranes, wherein the adjuster is configured to adjust a tension or free length of the one or more membranes or adjust a position of a node of the one or more membranes.

18. The lithographic apparatus according to claim 16, wherein the acoustic filter comprises a plurality of flexible membranes that are arranged around the axis of the conduit, wherein the plurality of membranes is arranged such that at least part of the gas flow is incident on a first side of the plurality of membranes and such that at least part of the gas flow that flows in the conduit in a direction along the axis and that passes the plurality of membranes in that direction is incident on a second, opposite side of the same plurality of membranes.

19. The lithographic apparatus according to claim 18, wherein a first one of the plurality of membranes differs from a second one of the plurality of membranes in at least one parameter selected from the group consisting of: size, tension, density, modulus of elasticity, and shape.

20. A lithographic apparatus configured to image a pattern onto a substrate, the apparatus comprising:
a conduit having an axis along which a gas can flow;
a wall that extends transverse to the axis of the conduit and extends at least partly into the interior of the conduit, the wall defining a membrane aperture therein and having a flow aperture configured to allow the gas to flow therethrough from a first side of the membrane aperture to a second opposite side of the membrane aperture and the conduit extends away from opposite sides of the wall so as to allow the gas to flow through the conduit at each of the opposite sides; and
an acoustic filter comprising a flexible membrane fixed in the membrane aperture and in the conduit.

21. The lithographic apparatus according to claim 20, wherein the wall has a plurality of membrane apertures therein and a corresponding plurality of membranes, each membrane being fixed in a respective one of the membrane apertures.

22. The lithographic apparatus according to claim 21, wherein a first one of the plurality of membranes differs from a second one of the plurality of membranes in at least one parameter selected from the group consisting of: size, tension, density, modulus of elasticity, and shape.

* * * * *